United States Patent [19]
Cunningham

[11] Patent Number: 6,040,523
[45] Date of Patent: *Mar. 21, 2000

[54] SNAP-FIT DESIGN OF AN AIRBORNE MISSILE SYSTEMS SEEKER/DETECTOR SECTION USING ENGINEERING PLASTICS

[75] Inventor: Robert J. Cunningham, Plano, Tex.

[73] Assignee: Raytheon Company, Lexington, Mass.

[*] Notice: This patent issued on a continued prosecution application filed under 37 CFR 1.53(d), and is subject to the twenty year patent term provisions of 35 U.S.C. 154(a)(2).

[21] Appl. No.: 08/982,554

[22] Filed: Dec. 1, 1997

Related U.S. Application Data

[60] Provisional application No. 60/032,822, Dec. 11, 1996, abandoned.

[51] Int. Cl.[7] .................................................. H05K 9/00
[52] U.S. Cl. ........................................ 174/35 R; 244/3.16
[58] Field of Search ........................... 174/35 R, 35 GC; 361/816, 818; 257/435, 680; 244/3.16

[56] References Cited

U.S. PATENT DOCUMENTS

| | | | |
|---|---|---|---|
| 3,824,422 | 7/1974 | Van der Walt et al. | 313/218 |
| 5,066,937 | 11/1991 | Moran | 336/84 |
| 5,082,338 | 1/1992 | Hodge | 385/81 |
| 5,219,132 | 6/1993 | Beckerleg et al. | 244/3.16 |
| 5,262,630 | 11/1993 | Kordulla | 250/203.6 |
| 5,337,396 | 8/1994 | Chen et al. | 385/92 |
| 5,404,814 | 4/1995 | Fisch et al. | 102/293 |
| 5,455,587 | 10/1995 | Schneider | 244/3.19 |
| 5,693,907 | 12/1997 | Rudnik | 102/293 |
| 5,847,938 | 12/1998 | Gammon | 361/816 |

FOREIGN PATENT DOCUMENTS

| | | |
|---|---|---|
| 2098455A | 6/1992 | Canada . |
| 61280044 | 12/1986 | Japan . |
| 04294306 | 10/1992 | Japan . |

*Primary Examiner*—Kristine Kincaid
*Assistant Examiner*—Hung V Ngo
*Attorney, Agent, or Firm*—Baker Botts L.L.P.

[57] ABSTRACT

A detector/seeker assembly which includes an electrically conductive molded plastic two-piece housing including a relatively rigid bulkhead portion having a groove and a dome portion having a sidewall extending over and adjacent to the bulkhead portion. The dome portion has a plurality of relatively flexible tabs, a part of each tab extending into the groove and making mechanical contact with the bulkhead portion via the groove to provide a press fit therebetween. An electrically conductive barrel is disposed within the housing and is electrically connected via an electrically conductive o-ring to the bulkhead to form an electrically shielded first chamber within the housing for containing equipment to be shielded from electromagnetic radiations therein. A second chamber for containing optics therein is provided by a groove disposed in the barrel and one in the dome with an o-ring disposed in the groove and contacting the barrel and the dome to provide a seal therebetween.

17 Claims, 2 Drawing Sheets ize constraints of many airborne systems, especially those used for military purposes, the metallic forms are generally relatively expensive, require tight tolerances at joint and interface areas, require difficult swaging operations or adhesive based assembly and require extensive additional metallic fastening hardware for cable connections. Also, if thin metallic components were damaged or bent at joint areas prior to assembly, system protection could be severely compromised. Though systems of the type described above have been used for many years and represent the prior state of the art, it is apparent that such systems have significant drawbacks including high cost and intricate assembly methods.

SNAP-FIT DESIGN OF AN AIRBORNE MISSILE SYSTEMS SEEKER/DETECTOR SECTION USING ENGINEERING PLASTICS

CROSS REFERENCE TO RELATED APPLICATIONS

This application claims priority under 35 USC § 119 of provisional application No. 60/032,822 filed Dec. 11, 1996, now abandoned.

This application is related to Ser. No. 08/985,385 filed Dec. 4, 1997, which is a continuation of Provisional Application Ser. No. 60/033,116 filed Dec. 18, 1996, now abandoned.

BACKGROUND OF THE INVENTION

1. Field of the Invention

This invention relates to electrically conductive plastic housings, principally for optics, optical sensors, electronic printed wiring boards and other systems and devices, the operation of which may be adversely affected by magnetic and/or radio frequency interference, for use in airborne detector systems and principally airborne missile guidance systems and the like.

2. Brief Description of the Prior Art

Guided airborne detector systems for dynamic airborne systems generally include, as a part of the airborne detector system, a detector guidance section for detecting target location and a control section for controlling airborne system trajectory in response to signals received from the detector guidance section in order to direct the airborne system to a selected target. Such detector and control systems must provide accurate and reliable outputs in order to insure that the desired trajectory is adhered to and that the ultimate target is reached. A problem with the detector and control electronics in such systems has been that magnetic and/or radio frequency interference emanating from the detector and/or the control section and/or other outside sources has been picked up by the airborne system electronics, thereby causing inaccurate readings to be provided, resulting in inaccurate trajectories with resultant failure to arrive at the desired target. For this reason, adequate shielding of the electrical components, cables and electrical interfaces between the detector, guidance and control sections of the airborne system has been critical to the accuracy and precision of the guidance which is required of the system.

In the prior art, this problem has been minimized by packaging and protecting electronic hardware and connections in the above described dynamic airborne systems from components fabricated from specially formed metallic housings, fastening hardware and interconnect components. The metallic forms were often expensive to produce, requiring tight tolerances at joint and cable interface areas. In view of the aerodynamic shape and

SUMMARY OF THE INVENTION

In accordance with the present invention, there is provided an assembly which minimizes the above noted problems of the prior art and which can be provided relatively inexpensively as compared with the above described prior art.

Briefly, there is provided an assembly of four separate parts which include a two piece enclosure or housing of electrically conductive moldable plastic including a barrel portion and a bulkhead portion as well as a dome and an optics retainer which all snap together to create two separate chambers. One chamber holds the lens, filter and desiccant, thereby creating a dry environment to prevent moisture intrusion into the optics. The other chamber is also sealed and holds the optical sensor, detector electronics and also provides an exit path for wires. The dome portion is formed with optically transmissive material such as, for example, a polycarbonate resin, capable of transmission of the light frequencies of interest, generally but not limited to infrared. The barrel and bulkhead portions are formed of electrically conductive moldable plastic materials that are well known and can be, for example, a moldable plastic material having electrically conductive fibers therein in sufficient quantity to provide electrical conductivity. Upon assembly, the elements become a two chamber self-contained unit by snapping the dome housing portion over the outer surface of the bulkhead housing portion without the requirement of separate fasteners or a separate fastening operation. The enclosure portions lock together in a press fit via flexible tabs with inwardly facing fingers or extensions at the tab ends in the dome portion which engage a groove in the bulkhead portion.

Electrically conductivity between the enclosure pieces is maintained via the barrel which contains a groove disposed adjacent the bulkhead portion which receives an electrically conductive o-ring to provide an electrically conductive path between the barrel and the bulkhead. This provides the electrically conductive shield for the electronic assembly which is disposed in the chamber formed by a portion of the enclosure and the barrel.

The use of electrically conductive plastic forms, which combine parts of relative movement while providing adequate shielding, reduces part count, cost, weight and assembly time. The use of electrically conductive plastics also eliminates the need to machine high tolerances associated with metallic components, thereby reducing cost and the potential for defective parts. The assembly in accordance with the present invention shields the optical sensor, electrical components and provides an adequate electrically conductive path for cable termination using the two piece electrically conductive plastic housing which is joined by an overlapped press fit. Cable termination is achieved using a simple threaded adapter which is fastened into one plastic enclosure portion, thereby creating an electrically conductive path between electrically conductive material, such as, for example, electrically conductive fibers, in the plastic and the metallic cable braid. Both the optical sensor and electrical components are mounted within the two piece housing during assembly.

DESCRIPTION OF THE PREFERRED EMBODIMENT

Figure 1:
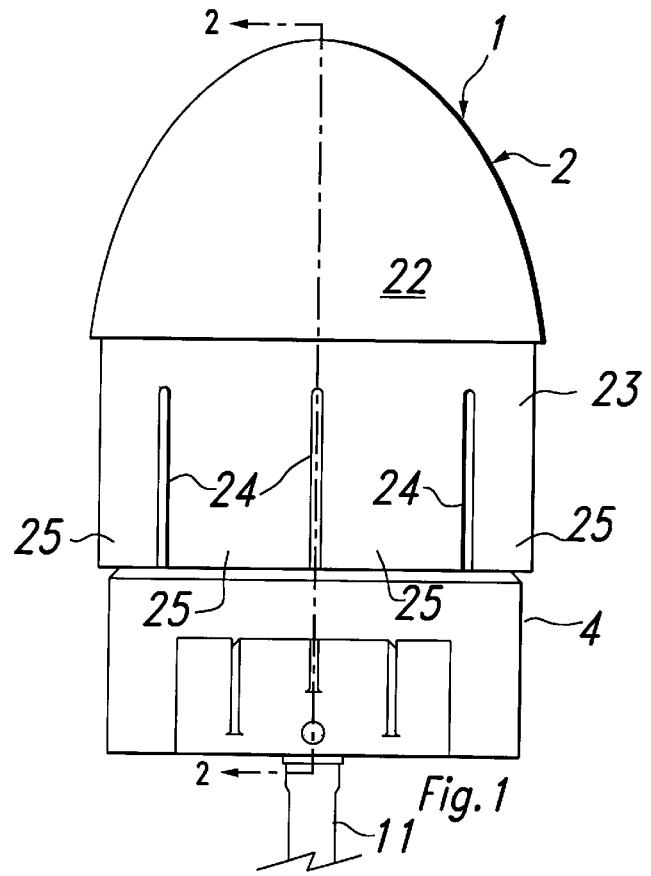
FIG. 1 is a side view of a detector assembly in accordance with the present invention.

Referring to FIG. 1, there is shown a side view of a detector assembly 1 in accordance with a preferred embodiment of the invention. The assembly is circular in cross-section through its axis a dome portion 2 formed of optically transmissive material and a bulkhead portion 4 coupled to the dome portion formed of electrically conductive plastic. The dome portion 2 includes an ellipsoid-shaped portion 22 of circular cross-section with continually increasing radius from the ellipsoid apex and then includes a following portion of circular cross-section with constant radius 23 extending to the edge of the ellipsoid-shaped portion. A plurality of spaced apart slits 24 extend around the portion 23 and extend in a direction parallel to the axis of the detector assembly 1. The slits 24 permit the tabs 25 formed by and between the slits to be flexible for engagement with the bulkhead portion 4 as will be explained hereinbelow to provide a press fit.

Figure 2:
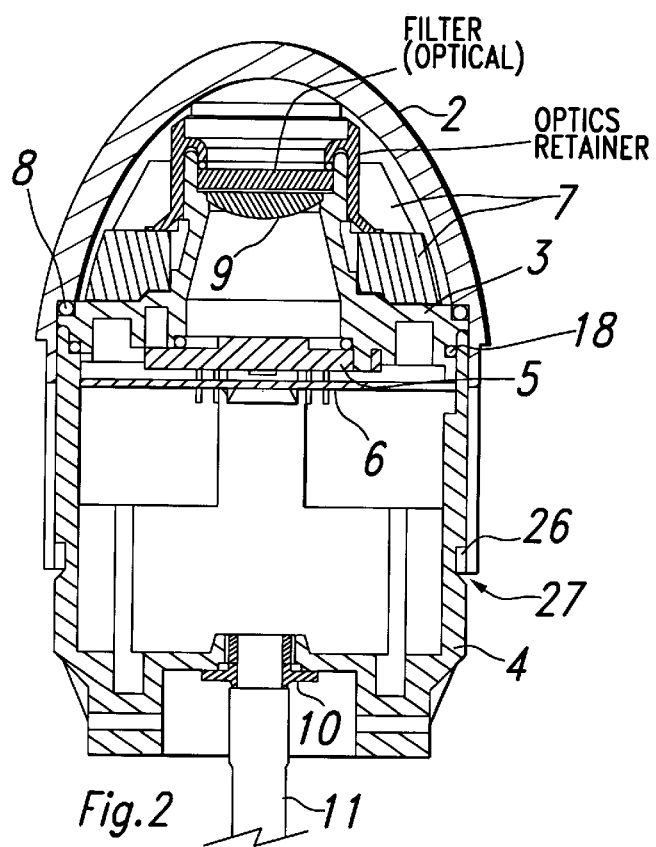
FIG. 2 is a cross-sectional view of the detector assembly of FIG. 1 taken along the line 2—2 of FIG. 1.
Figure 3:
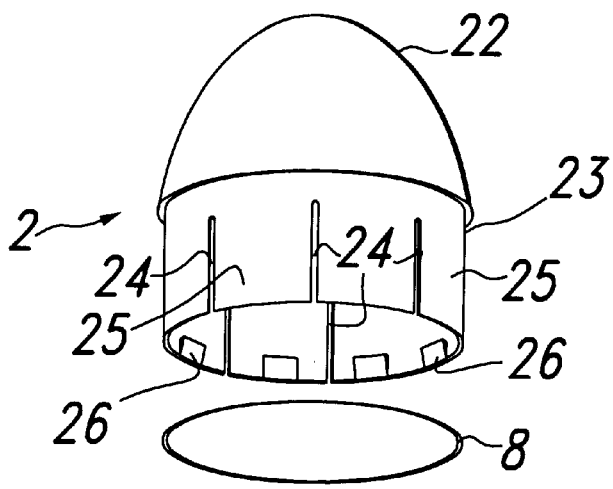
FIG. 3 is an exploded view of the detector assembly as shown in FIG. 2.
Figure 3:
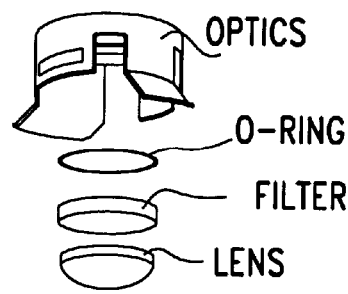
Figure 3:
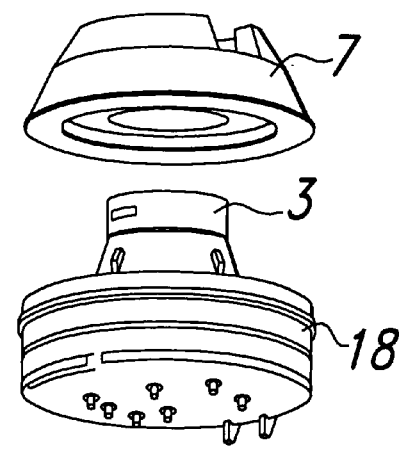
Figure 3:
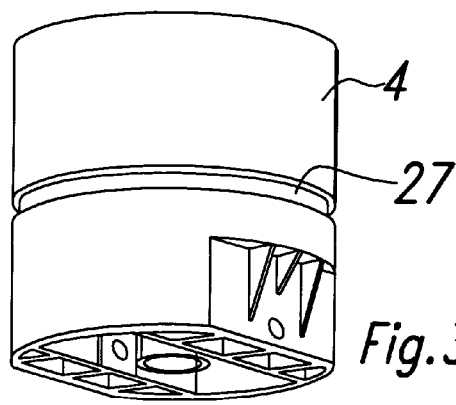

Referring to FIGS. 2 and 3, it can be seen that the housing portion 23 of dome portion 2 is thinner than the housing portion 22, thereby providing the flexibility to the portion 23 of the dome portion required for engagement with the bulkhead 4 while providing a rigid housing portion 22. The edge of the dome portion 23 includes an inwardly extending lip 26 which engages in a circular groove 27 disposed in the outer wall of the bulkhead 4 to provide a press fit between the dome portion 2 and the bulkhead 4. The fit is preferably sufficiently tight and the tabs 25 are sufficiently rigid to require a substantial force to pry the tabs out of the groove 27. A barrel 3 formed of electrically conductive material, preferably the same type of material as the bulkhead 4 has an annular groove with an annular electrically conductive o-ring 18 within the groove, this groove being disposed adjacent the bulkhead 4 with the o-ring contacting the bulkhead. An o-ring 8 to provide a seal between the dome 2 and the barrel 3 is disposed in a groove formed partly in the barrel and partly in the interior wall of the dome portion 22. The combination of the barrel 3 and the bulkhead 4 substantially form a first chamber with electrically conductive chamber walls behind the lens 9. The first chamber contains the electronics therein which is demonstrated by way of example by a detector chip 5 and a circuit board 6, both coupled to a portion of the barrel 3 within the first chamber. The barrel 3 forms a second chamber with the dome portion 2 which houses the optics in a dry atmosphere. A desiccant 7 which is disposed within the second chamber and external to the first chamber insures the arid conditions in the second chamber. The optics and electronics are the standard optics and electronics of such detector/seeker assemblies and are not described in detail since they form no part of the invention herein. Also shown is a cable assembly connection 9 extending out of the housing 1 with wiring therein which also forms no part of the invention and will not be further explained.

It can be seen that there has been provided a simple, low cost enclosure for use as a detector/seeker assembly, generally in high speed airborne equipment which is exposed to the environment, which provided the required shielding, yet can be easily assembled.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. A detector/seeker assembly which comprises:

an electrically conductive molded plastic two-piece housing including a relatively rigid electrically conductive first housing portion having a groove and a second housing portion having a sidewall extending over and adjacent said first housing portion, said second housing portion having a plurality of relatively flexible tab portions, a part of each of said tab portions extending into said groove and making mechanical contact with said first housing portion via said groove to provide a press fit therebetween;

an electrically conductive member disposed within said housing and electrically connected to said first housing portion to form an electrically shielded first chamber within said housing for containing equipment to be shielded from electromagnetic radiations therein and a second chamber for containing optics therein; and a second groove disposed in at least one of said member and said first housing portion and an electrically conductive o-ring disposed in said second groove and contacting said member and said first housing portion to provide an electrically conductive path between said member and said first housing portion.

2. The assembly of claim 1 further including a third groove disposed at least in part in said second housing portion and a second o-ring disposed in said third groove and contacting said second housing portion to provide a seal between said member and said second housing portion.

3. A detector/seeker assembly which comprises:

an electrically conductive molded plastic two-piece housing including a relatively rigid electrically conductive first housing portion having a groove and a second housing portion having a sidewall extending over and adjacent said first housing portion, said second housing portion having a plurality of relatively flexible tab portions, a part of each of said tab portions extending into said groove and making mechanical contact with said first housing portion via said groove to provide a press fit therebetween;

an electrically conductive member disposed within said housing and electrically connected to said first housing portion to form an electrically shielded first chamber within said housing for containing equipment to be shielded from electromagnetic radiations therein and a second chamber for containing optics therein, said equipment to be shielded being secured to said member; and a second groove disposed in at least one of said member and said first housing portion and an electrically conductive o-ring disposed in said second groove and contacting said member and said first housing portion to provide an electrically conductive path between said member and said first housing portion.

4. The assembly of claim 3 further including a third groove disposed at least in part in said third housing portion and a second o-ring disposed in said groove and contacting said second housing portion to provide a seal between said member and said second housing portion.

5. A detector/seeker assembly which comprises:

an electrically conductive molded plastic two-piece housing including a relatively rigid electrically conductive first housing portion having a groove and a second housing portion having a sidewall extending over and adjacent said first housing portion, said second housing portion having a plurality of relatively flexible tab portions, a part of each of said tab portions extending into said groove and making mechanical contact with said first housing portion via said groove to provide a press fit therebetween;

an electrically conductive member disposed within said housing and electrically connected to said first housing portion to form an electrically shielded first chamber within said housing for containing equipment to be shielded from electromagnetic radiations therein and a second chamber for containing optics therein; and a second groove disposed at least in part in said second housing portion and a second o-ring disposed in said second groove and contacting said second housing portion to provide a seal between said member and said second housing portion.

6. A detector/seeker assembly which comprises:

an electrically conductive molded plastic two-piece housing including a relatively rigid electrically conductive first housing portion having a groove and a second housing portion having a sidewall extending over and adjacent said first housing portion, said second housing portion having a plurality of relatively flexible tab portions, a part of each of said tab portions extending into said groove and making mechanical contact with said first housing portion via said groove to provide a press fit therebetween;

an electrically conductive member disposed within said housing and electrically connected to said first housing portion to form an electrically shielded first chamber within said housing for containing equipment to be shielded from electromagnetic radiations therein and a second chamber for containing optics therein, said equipment to be shielded being secured to said member; and a second groove disposed at least in part in said second housing portion and a second o-ring disposed in said second groove and contacting said second housing portion to provide a seal between said member and said second housing portion.

7. An apparatus, comprising:

a housing which includes first and second housing portions, and snap fastening structure provided on said first and second housing portions and operative to releasably couple said first and second housing portions together, said first and second housing portions defining a housing chamber within said housing when coupled by said fastening structure, and said first housing portion having an optically transparent portion through which radiation can enter said housing chamber;

a member which is supported within said housing chamber and divides said housing chamber into a first chamber and a second chamber, wherein radiation passing through said optically transparent portion enters said first chamber;

an optics system provided within said first chamber, said optics system including a detector responsive to radiation which enters said first chamber through said transparent portion; and a circuit which is provided within said second chamber and which is operatively coupled to said detector.

8. An apparatus according to claim 7, wherein said fastening structure is integral to said first and second housing portions, and includes one of said first and second housing portions having in an exterior surface thereof a groove which extends therearound, and includes the other of said first and second housing portions having thereon a plurality of flexible tabs which each have at an outer end thereof a lip engageable with said groove.

9. An apparatus according to claim 8, wherein said member and said first and second housing portions are each made from a plastic material.

10. An apparatus according to claim 7, wherein said first housing portion includes a dome-shaped portion, and said domed-shaped portion includes said transparent portion.

11. An apparatus according to claim 7, wherein said member has an edge portion which extends around a periphery thereof, said housing including further structure cooperable with said edge portion of said member to maintain said member in place when said first and second housing portions are releasably coupled by said fastening structure and to permit said member to freely separate from said first and second housing portions when said first and second housing portions are physically separated from each other with said fastening structure disengaged.

12. An apparatus according to claim 11, wherein said further structure includes a seal element which effects a seal between said member and said first housing portion; and including a desiccant disposed within said first chamber.

13. An apparatus according to claim 12, wherein said member and said second housing portion are each made from an electrically conductive material, and wherein said further structure includes an electrically conductive element which is disposed between and electrically couples said member and said second housing portion, so that said second chamber is shielded from electromagnetic radiation.

14. An apparatus according to claim 13, wherein said member and said first and second housing portions are each made from a plastic material, wherein said seal element is an o-ring, and wherein said electrically conductive element is an o-ring.

15. An apparatus according to claim 7, wherein said detector is supported on said member; and wherein said optics system includes a lens which is supported on said member at a location spaced from said detector, said lens being disposed between said detector and said transparent portion so that radiation traveling from said transparent portion to said detector passes through said lens.

16. An apparatus according to claim 15, wherein said optics system includes an optical filter supported on said member adjacent said lens, in a manner so that radiation passes through said filter before passing through said lens; and including an optics retainer supported on said member to hold said lens and said filter in place on said member.

17. An apparatus according to claim 16, including a seal element which is disposed between and effects a seal between said member and said first housing portion, and including a desiccant disposed in said first chamber, said desiccant being held in place between said member and a portion of said optics retainer.

* * * * *